United States Patent
Hyun et al.

(10) Patent No.: US 10,469,100 B2
(45) Date of Patent: Nov. 5, 2019

(54) METHOD FOR TRANSMITTING AND RECEIVING COMPRESSED DATA AND APPARATUS FOR THE SAME

(71) Applicant: ELECTRONICS AND TELECOMMUNICATIONS RESEARCH INSTITUTE, Daejeon (KR)

(72) Inventors: Eun-Hee Hyun, Daejeon (KR); Je-Won Lee, Daejeon (KR); Heung-Mook Kim, Daejeon (KR); Joon-Young Jung, Daejeon (KR); Tae-Kyoon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/208,732

(22) Filed: Dec. 4, 2018

(65) Prior Publication Data

US 2019/0173487 A1 Jun. 6, 2019

(30) Foreign Application Priority Data

Dec. 6, 2017 (KR) ........................ 10-2017-0166366

(51) Int. Cl.
*H03M 7/30* (2006.01)
*H04L 27/36* (2006.01)
*H04L 27/38* (2006.01)

(52) U.S. Cl.
CPC ....... *H03M 7/3062* (2013.01); *H03M 7/3082* (2013.01); *H04L 27/364* (2013.01); *H04L 27/3854* (2013.01)

(58) Field of Classification Search
CPC . H03M 7/3062; H03M 7/3082; H04L 27/364; H04L 27/3854
See application file for complete search history.

(56) References Cited

U.S. PATENT DOCUMENTS 5,818,368 A 10/1998 Langley
8,842,724 B1 * 9/2014 Joung ................. H03M 7/3062
375/240

(Continued)

FOREIGN PATENT DOCUMENTS

KR 10-2015-0096217 A 8/2015
KR 10-1700537 B1 1/2017

*Primary Examiner* — Jaison Joseph
(74) *Attorney, Agent, or Firm* — NSIP Law

(57) ABSTRACT

Disclosed herein are a method for transmitting and receiving compressed data and an apparatus therefor. According to the method for transmitting compressed data, a transmission apparatus for transmitting compressed data standardizes the value of an In-phase/Quadrature-phase (IQ) data sample to a preset type that is selected from among a positive number and a negative number, determines the sample type of the IQ data sample, the value of which is standardized to the preset type, based on a sample type determination rule, generates a compressed bit string based on the compression rule pertaining to the determined sample type, generates compressed data, including at least one of a reference bit corresponding to the sample type, the sign bit of the IQ data sample, and the compressed bit string, for each IQ data sample, and transmits the compressed data to a reception apparatus.

20 Claims, 10 Drawing Sheets

(56) References Cited

U.S. PATENT DOCUMENTS

| | | | |
|---|---|---|---|
| 9,059,970 B1* | 6/2015 | Joung | H03M 7/30 |
| 2011/0099295 A1* | 4/2011 | Wegener | H03M 7/24 |
| | | | 709/247 |
| 2015/0236714 A1 | 8/2015 | Jo | |
| 2015/0348231 A1 | 12/2015 | Jo | |
| 2015/0358030 A1* | 12/2015 | Xia | H03M 7/3082 |
| | | | 341/87 |
| 2017/0238361 A1* | 8/2017 | Pawar | H03M 7/40 |
| | | | 455/561 |
| 2019/0173490 A1* | 6/2019 | Lee | H03M 7/6047 |

* cited by examiner

FIG. 3

| SV | 16 | 15 | 14 | 13 | 12 | 11 | 10 | 9 | 8 | 7 | 6 | 5 | 4 | 3 | 4 | 3 |
|---|---|---|---|---|---|---|---|---|---|---|---|---|---|---|---|---|
| $B_0$ | 1 | 1 | 1 | 1 | 1 | 1 | 1 | 1 | 1 | 1 | 1 | 1 | 1 | 1 | 1 | 1 |
| $B_1$ | 1 | 1 | 1 | 1 | 1 | 1 | 1 | 1 | 1 | 1 | 1 | 1 | 1 | 0 | 0 | 1 |
| $B_2$ | 1 | 1 | 1 | 1 | 1 | 1 | 1 | 1 | 1 | 1 | 1 | 1 | 1 | 0 | 1 | 1 |
| $B_3$ | 0 | 0 | 0 | 0 | 0 | 1 | 0 | 1 | 0 | 1 | 0 | 1 | 0 | 0 | 0 | 1 |
| $B_4$ | 0 | 0 | 0 | 0 | 0 | 1 | 0 | 0 | 0 | 1 | 0 | 0 | 1 | 0 | 0 | 1 |
| $B_5$ | 0 | 0 | 0 | 0 | 0 | 0 | 0 | 1 | 1 | 0 | 0 | 0 | 1 | 0 | 1 | 1 |
| $B_6$ | 0 | 0 | 0 | 0 | 0 | 0 | 1 | 1 | 0 | 0 | 0 | 0 | 1 | 0 | 1 | 1 |
| $B_7$ | 0 | 0 | 1 | 0 | 0 | 1 | 1 | 0 | 0 | 0 | 0 | 0 | 1 | 0 | 1 | 1 |
| $B_8$ | 0 | 0 | 0 | 0 | 1 | 1 | 0 | 1 | 0 | 0 | 0 | 1 | 0 | 1 | 0 | 1 |
| $B_9$ | 0 | 0 | 1 | 0 | 1 | 0 | 1 | 0 | 1 | 0 | 0 | 1 | 0 | 1 | 0 | 1 |
| $B_{10}$ | 0 | 0 | 1 | 0 | 1 | 0 | 0 | 1 | 0 | 0 | 0 | 1 | 0 | 1 | 0 | 1 |
| $B_{11}$ | 0 | 0 | 0 | 1 | 0 | 0 | 0 | 1 | 0 | 1 | 0 | 0 | 1 | 0 | 0 | 1 |
| $B_{12}$ | 0 | 0 | 1 | 0 | 0 | 0 | 1 | 1 | 1 | 0 | 0 | 1 | 1 | 0 | 0 | 1 |
| $B_{13}$ | 1 | 1 | 0 | 0 | 0 | 1 | 0 | 1 | 1 | 0 | 0 | 0 | 1 | 0 | 0 | 1 |
| $B_{14}$ | 1 | 0 | 0 | 0 | 0 | 1 | 0 | 1 | 0 | 1 | 0 | 0 | 1 | 0 | 1 | 1 |
| $B_{15}$ | 0 | 0 | 0 | 0 | 1 | 0 | 1 | 0 | 1 | 0 | 0 | 0 | 1 | 0 | 1 | 1 |

|   | $B_{16}$ | $B_{15}$ | $B_{14}$ | $B_{13}$ | $B_{12}$ | $B_{11}$ | $B_{10}$ | $B_9$ | $B_8$ | $B_7$ | $B_6$ | $B_5$ | $B_4$ | $B_3$ | $B_2$ | $B_1$ |
|---|---|---|---|---|---|---|---|---|---|---|---|---|---|---|---|---|
| ① | 1 | 1 | 1 | 1 | 1 | 1 | 1 | 0 | 1 | 1 | 1 | 0 | 1 | 1 | 0 | 1 |
| ② | 1 | 1 | 1 | 0 | 0 | 1 | 1 | 0 | 0 | 0 | 0 | 1 | 1 | 0 | 1 | 0 |
| ③ | 1 | 1 | 1 | 1 | 1 | 1 | 0 | 1 | 0 | 1 | 1 | 0 | 0 | 1 | 1 | 0 |
| ④ | 0 | 0 | 0 | 0 | 0 | 0 | 0 | 0 | 1 | 1 | 1 | 0 | 0 | 0 | 1 | 1 |
| ⑤ | 0 | 0 | 0 | 0 | 1 | 0 | 0 | 0 | 0 | 0 | 1 | 0 | 1 | 0 | 1 | 1 |
| ⑥ | 1 | 1 | 1 | 1 | 1 | 1 | 1 | 1 | 1 | 1 | 0 | 0 | 0 | 1 | 0 | 0 |
| ⑦ | 1 | 1 | 0 | 1 | 1 | 0 | 0 | 1 | 0 | 1 | 1 | 0 | 0 | 1 | 1 | 1 |
| ⑧ | 0 | 0 | 0 | 1 | 0 | 0 | 0 | 1 | 0 | 1 | 1 | 1 | 0 | 0 | 1 | 1 |
| ⑨ | 1 | 1 | 1 | 0 | 1 | 1 | 1 | 1 | 1 | 1 | 0 | 0 | 0 | 0 | 1 | 1 |
| ⑩ | 1 | 1 | 1 | 1 | 1 | 1 | 1 | 1 | 0 | 0 | 0 | 0 | 1 | 1 | 1 | 0 |

FIG. 4

|   | $B_{16}$ | $B_{15}$ | $B_{14}$ | $B_{13}$ | $B_{12}$ | $B_{11}$ | $B_{10}$ | $B_9$ | $B_8$ | $B_7$ | $B_6$ | $B_5$ | $B_4$ | $B_3$ | $B_2$ | $B_1$ |
|---|---|---|---|---|---|---|---|---|---|---|---|---|---|---|---|---|
| ① | 0 | 0 | 0 | 0 | 0 | 0 | 0 | 1 | 0 | 0 | 0 | 1 | 0 | 0 | 1 | 1 |
| ② | 0 | 0 | 0 | 1 | 1 | 0 | 0 | 1 | 1 | 1 | 1 | 0 | 0 | 1 | 1 | 0 |
| ③ | 0 | 0 | 0 | 0 | 0 | 0 | 1 | 0 | 1 | 0 | 0 | 1 | 1 | 0 | 1 | 0 |
| ④ | 0 | 0 | 0 | 0 | 0 | 0 | 0 | 0 | 1 | 1 | 1 | 0 | 0 | 0 | 1 | 1 |
| ⑤ | 0 | 0 | 0 | 0 | 1 | 0 | 0 | 0 | 0 | 1 | 0 | 1 | 0 | 1 | 1 | 1 |
| ⑥ | 0 | 0 | 0 | 0 | 0 | 0 | 0 | 0 | 0 | 0 | 1 | 1 | 1 | 1 | 0 | 0 |
| ⑦ | 0 | 0 | 1 | 0 | 0 | 1 | 1 | 0 | 1 | 0 | 0 | 1 | 1 | 0 | 0 | 1 |
| ⑧ | 0 | 0 | 0 | 1 | 0 | 0 | 0 | 1 | 0 | 1 | 1 | 1 | 0 | 0 | 1 | 1 |
| ⑨ | 0 | 0 | 0 | 0 | 1 | 0 | 0 | 0 | 0 | 0 | 1 | 1 | 1 | 1 | 0 | 1 |
| ⑩ | 0 | 0 | 0 | 0 | 0 | 0 | 0 | 0 | 1 | 1 | 1 | 1 | 0 | 0 | 1 | 0 |

| SIGN BIT | | $B_{16}$ | $B_{15}$ | $B_{14}$ | $B_{13}$ | $B_{12}$ | $B_{11}$ | $B_{10}$ | $B_9$ | $B_8$ | $B_7$ | $B_6$ | $B_5$ | $B_4$ | $B_3$ | $B_2$ | $B_1$ |
|---|---|---|---|---|---|---|---|---|---|---|---|---|---|---|---|---|---|
| 1 | ① | 0 | 0 | 0 | 0 | 0 | 0 | 0 | 1 | 0 | 0 | 0 | 1 | 0 | 0 | 1 | 1 |
| 1 | ② | 0 | 0 | 0 | 1 | 1 | 0 | 0 | 1 | 1 | 1 | 1 | 0 | 0 | 1 | 1 | 0 |
| 1 | ③ | 0 | 0 | 0 | 0 | 0 | 0 | 1 | 0 | 1 | 0 | 0 | 1 | 1 | 0 | 1 | 0 |
| 0 | ④ | 0 | 0 | 0 | 0 | 0 | 0 | 0 | 0 | 1 | 1 | 1 | 0 | 0 | 0 | 1 | 1 |
| 0 | ⑤ | 0 | 0 | 0 | 0 | 1 | 0 | 0 | 0 | 0 | 0 | 1 | 0 | 1 | 0 | 1 | 1 |
| 1 | ⑥ | 0 | 0 | 0 | 0 | 0 | 0 | 0 | 0 | 0 | 0 | 1 | 1 | 1 | 1 | 0 | 0 |
| 1 | ⑦ | 0 | 0 | 1 | 0 | 0 | 1 | 1 | 0 | 1 | 0 | 0 | 1 | 1 | 0 | 0 | 1 |
| 0 | ⑧ | 0 | 0 | 0 | 1 | 0 | 0 | 0 | 1 | 0 | 1 | 1 | 1 | 0 | 0 | 1 | 1 |
| 1 | ⑨ | 0 | 0 | 0 | 0 | 1 | 0 | 0 | 0 | 0 | 0 | 1 | 1 | 1 | 1 | 0 | 1 |
| 1 | ⑩ | 0 | 0 | 0 | 0 | 0 | 0 | 0 | 0 | 1 | 1 | 1 | 1 | 0 | 0 | 1 | 0 |

METHOD FOR TRANSMITTING AND RECEIVING COMPRESSED DATA AND APPARATUS FOR THE SAME

CROSS REFERENCE TO RELATED APPLICATION

This application claims the benefit of Korean Patent Application No. 10-2017-0166366, filed Dec. 6, 2017, which is hereby incorporated by reference in its entirety into this application.

BACKGROUND OF THE INVENTION

Technical Field

The present invention relates generally to technology for transmitting and receiving compressed data, and more particularly to a method for transmitting and receiving compressed data, which may minimize transmission delay attributable to data compression and improve transmission efficiency, and an apparatus for the same.

Description of the Related Art

In most RF signal transmission sections, regardless of whether transmission is performed in a wired or wireless environment, an analog signal is converted into a digital signal and then processed and transmitted as In-phase/Quadrature-phase (I/O) data, which is configured with a specific bit string consisting of 15 bits, 16 bits, or the like. Here, in order to transmit as much data as possible in a limited frequency band, IQ data is compressed.

Generally, data is transmitted from broadcasting equipment or a network facility, which functions to transmit content, to personal terminals. Because such downstream data is compressed by transmission devices, even though a compression algorithm is somewhat complicated, the compression algorithm may be adequately processed thanks to the performance of transmission devices or the environment including the transmission devices. In this case, because a reception device receives the compressed data and reconstructs the data based on a defined rule, the algorithm processed by the reception device is less complicated than the algorithm processed by the transmission device.

However, recently, with an increase in the number of services using upstream content, the amount of upstream content is increased. Accordingly, it is necessary to apply a compression algorithm not only to downstream data but also to upstream data. In the case of upstream data, a personal terminal must process a compression algorithm, but it is not easy for the personal terminal to apply a compression algorithm having high complexity and a high computational load without change. Particularly, when time-synchronized data is to be transmitted and received between a system and a terminal, it is necessary to minimize factors that may delay data transmission therebetween.

Accordingly, when a compression algorithm is applied to upstream data, it is required to design a method that may decrease complexity and minimize time delay.

A block scaling method is a compression method commonly used in I/O data transmission segments, and is configured such that a scaling factor is applied to a block that is formed by collecting a fixed number (16 or 32) of IQ samples, whereby the number of bits (e.g., 15 or 16 bits) in each IQ sample is decreased to a smaller number of bits (e.g., 10 or 7 bits).

However, this compression method causes compression delay, which may result in transmission delay, because compression is delayed until a fixed number of samples is input in order to construct a compression block. Further, because a compression method based on a single rule is applied to all of the samples in each compression block, the compression method may be optimally applied to a certain sample therein, but efficiency may be decreased, or the compression block may still include data to which additional compression can be applied even after the compression method is applied. However, when different compression methods are applied to individual samples, the amount of additional information required when a reception device reconstructs a signal is increased, which decreases compression efficiency.

Documents of Related Art (Patent Document 1) Korean Patent Application Publication No. 10-2015-0096217, published on Aug. 24, 2015 and titled "Digital data compressing method and device thereof".

SUMMARY OF THE INVENTION

An object of the present invention is to provide a method for transmitting and receiving compressed data, which may improve compression efficiency and reduce signal transmission delay that may be caused due to I/O data compression.

Another object of the present invention is to apply different compression rules to I/O data samples depending on the distribution thereof, thereby reducing transmission delay that may be caused due to compression.

A further object of the present invention is to additionally include the sign bit of each IQ data sample in a target to be compressed by making IQ data samples have the same sign when data is compressed, thereby improving compression efficiency.

In order to accomplish the above objects, a method for transmitting compressed data according to the present invention may include standardizing, by a transmission apparatus for transmitting compressed data, the value of an In-phase/Quadrature-phase (IQ) data sample to a preset type that is selected from among a positive number and a negative number; determining, by the transmission apparatus, the sample type of the IQ data sample, the value of which is standardized to the preset type, based on a sample type determination rule and generating, by the transmission apparatus, a compressed bit string based on a compression rule pertaining to the sample type; and generating, by the transmission apparatus, compressed data, including at least one of a reference bit corresponding to the sample type, the sign bit of the IQ data sample, and the compressed bit string, for each IQ data sample and transmitting, by the transmission apparatus, the compressed data to a reception apparatus.

Here, the method may further include setting, by the transmission apparatus, two or more sample types corresponding to the sample type determination rule in consideration of the distribution of the valid bits of multiple IQ data samples created by quantization processing of RF (radio frequency) signal input to the transmission apparatus.

Here, the reference bit may be allocated in an amount of one bit in order to indicate any one sample type that accounts for the greatest proportion, among the two or more samples, and the reference bit may be allocated in an amount of at least two bits in order to indicate the remaining sample types, excluding the sample type that accounts for the greatest proportion.

Here, standardizing the value of the IQ data sample may be configured to convert the bits of the IQ data sample according to a two's complement operation when the value of the IQ data sample does not correspond to the preset type.

Here, standardizing the value of the IQ data sample may be configured to determine whether the value of the IQ data sample is a positive number or a negative number based on the sign bit.

Here, generating the compressed bit string may include dividing the IQ data sample into multiple groups of preset N bits based on the sample type determination rule; and determining the sample type depending on the value of at least one of leftmost N bits and N bits following the leftmost N bits.

Here, the compression rule may include parameter information corresponding to the target bits to be deleted from each sample type.

Here, generating the compressed bit string may be configured to delete the leftmost bit of the IQ data sample regardless of the sample type.

Here, the method may further include sharing, by the transmission apparatus, at least one of the sample type determination rule and the compression rule with the reception apparatus.

Also, a method for receiving compressed data according to an embodiment of the present invention may include determining, by a reception apparatus for receiving compressed data, the sample type of compressed data received from a transmission apparatus; reconstructing, by the reception apparatus, an In-phase/Quadrature-phase (IQ) data sample corresponding to the compressed data using a compression rule pertaining to the sample type; and correcting, by the reception apparatus, the IQ data sample by performing a two's complement operation on the IQ data sample based on a sign bit included in the compressed data.

Here, the method may further include receiving, by the reception apparatus, at least one of the compression rule and a sample type determination rule for determining the sample type from the transmission apparatus.

Here, determining the sample type may be configured to determine the sample type by comparing a reference bit included in the compressed data with a reference bit for each sample type included in the sample type determination rule.

Here, reconstructing the IQ data sample may include detecting the number of deleted upper bits and the number of deleted lower bits based on the compression rule; reconstructing as many bits as the number of deleted upper bits before the compressed bit string included in the compressed data in consideration of a preset type, which is either a positive number or a negative number; and generating a random value corresponding to the number of deleted lower bits and reconstructing bits after the compressed bit string using the random value.

Here, correcting the IQ data sample may be configured to convert the bits of the reconstructed IQ data sample according to a two's complement operation when the sign bit corresponds to the preset type.

Here, the compressed data may sequentially include a reference bit, the sign bit, and the compressed bit string corresponding to the IQ data sample.

Also, an apparatus for transmitting compressed data according to an embodiment of the present invention includes a processor for standardizing the value of an In-phase/Quadrature-phase (IQ) data sample to a preset type that is selected from among a positive number and a negative number, determining the sample type of the IQ data sample, the value of which is standardized to the preset type, based on a sample type determination rule, generating a compressed bit string based on a compression rule pertaining to the sample type, generating compressed data, which includes at least one of a reference bit corresponding to the sample type, the sign bit of the IQ data sample, and the compressed bit string, for each IQ data sample, and transmitting the compressed data to a reception apparatus; and memory for storing at least one of the sample type determination rule, the compression rule, and the preset type.

Here, the processor may set two or more sample types corresponding to the sample type determination rule in consideration of the distribution of the valid bits of multiple IQ data samples input to the apparatus.

Here, the reference bit may be allocated in an amount of one bit in order to indicate any one sample type that accounts for the greatest proportion, among the two or more samples, and the reference bit may be allocated in an amount of at least two bits in order to indicate the remaining sample types, excluding the sample type that accounts for the greatest proportion.

Here, the processor may convert the bits of the IQ data sample according to a two's complement operation when the value of the IQ data sample does not correspond to the preset type.

Here, the processor may determine whether the value of the IQ data sample is a positive number or a negative number based on the sign bit.

Here, the processor may divide the IQ data sample into multiple groups of N bits based on the sample type determination rule and determine the sample type depending on the value of at least one of leftmost N bits and N bits following the leftmost N bits.

Here, the compression rule may include parameter information corresponding to the target bits to be deleted from each sample type.

Here, the processor may delete the leftmost bit of the IQ data sample regardless of the sample type.

Here, the processor may share at least one of the sample type determination rule and the compression rule with the reception apparatus.

Also, an apparatus for receiving compressed data according to an embodiment of the present invention may determine the sample type of compressed data received from a transmission apparatus, reconstruct an In-phase/Quadrature-phase (IQ) data sample corresponding to the compressed data using a compression rule pertaining to the sample type, and correct the IQ data sample by performing a two's complement operation on the IQ data sample based on a sign bit included in the compressed data.

BRIEF DESCRIPTION OF THE DRAWINGS

The above and other objects, features and advantages of the present invention will be more clearly understood from the following detailed description taken in conjunction with the accompanying drawings, in which:

FIG. 3 is a view that shows an example of the type of a 16-bit sample that may be included in a single compression block;

FIG. 4 is a view that shows an example of multiple IQ data samples that are input before compression is applied;

FIG. 5 is a view that shows an example of the process of converting the multiple IQ data samples illustrated in FIG. 4 according to a two's complement operation according to the present invention;

FIG. 6 is a view that shows an example of the process of extracting a sign bit from each of the multiple IQ data samples illustrated in FIG. 5 and storing the sign bit according to the present invention;

FIG. 7 is a view that shows an example of the process of classifying the multiple IQ data samples illustrated in FIG. 6 depending on the types thereof and storing a reference bit for each type according to the present invention;

FIG. 8 is a view that shows an example of compressed data for the multiple IQ data samples illustrated in FIG. 7 according to the present invention;

DESCRIPTION OF THE PREFERRED EMBODIMENTS

Figure 1:
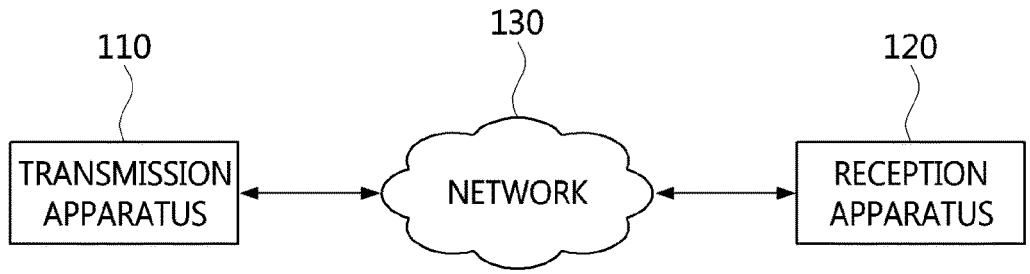
FIG. 1 is a block diagram that shows a system for transmitting and receiving compressed data according to an embodiment of the present invention.

The present invention will be described in detail below with reference to the accompanying drawings. Repeated descriptions and descriptions of known functions and configurations which have been deemed to unnecessarily obscure the gist of the present invention will be omitted below. The embodiments of the present invention are intended to fully describe the present invention to a person having ordinary knowledge in the art to which the present invention pertains. Accordingly, the shapes, sizes, etc. of components in the drawings may be exaggerated in order to make the description clearer.

Hereinafter, a preferred embodiment of the present invention will be described in detail with reference to the accompanying drawings.

FIG. 1 is a block diagram that shows a system for transmitting and receiving compressed data according to an embodiment of the present invention.

Referring to FIG. 1, the system for transmitting and receiving compressed data according to an embodiment of the present invention includes a transmission apparatus 110, a reception apparatus 120, and a network 130.

The transmission apparatus 110 is an apparatus for transmitting compressed data, and may transmit compressed data to the reception apparatus 120 through the following processes.

First, the transmission apparatus 110 standardizes the values of In-phase/Quadrature-phase (IQ) data samples to a preset type that is selected from among a positive number and a negative number.

Here, when the value of an IQ data sample does not correspond to the preset type, the bits of the IQ data sample may be converted according to a two's complement operation.

Here, whether the value of the IQ data sample is a positive number or a negative number may be determined based on the sign bit thereof.

Also, the transmission apparatus 110 determines the sample type of an IQ data sample based on a sample type determination rule and generates a compressed bit string based on a compression rule pertaining to the corresponding sample type.

Here, the transmission apparatus 110 may set two or more sample types for the sample type determination rule in consideration of distribution of the valid bits of multiple IQ data samples input to the transmission apparatus 110.

Here, an IQ data sample is divided into multiple groups of preset N bits based on the sample type determination rule, and the sample type may be determined depending on the value of at least one of the leftmost N bits and N bits following the leftmost N bits.

Here, a compression rule may include parameter information corresponding to the bits to be deleted depending on each sample type.

Here, regardless of the sample type, the most significant bit (leftmost bit) of the IQ data sample, the type of which is standardized to the preset type, may be deleted.

Also, the transmission apparatus 110 generates compressed data for each IQ data sample and transmits the same to the reception apparatus, the compressed data including at least one of a reference bit (or reference bits) corresponding to the sample type, the sign bit of the IQ data sample, and the compressed bit string.

Here, one reference bit may be allocated in order to indicate any one sample type that accounts for the greatest proportion, among two or more sample types, and at least two reference bits may be allocated in order to indicate the remaining sample types.

Also, the transmission apparatus 110 shares at least one of the sample type determination rule and the compression rule with the reception apparatus 120.

The reception apparatus 120 is an apparatus for receiving compressed data, and may receive compressed data from the transmission apparatus 110 through the following processes.

First, the reception apparatus 120 determines the sample type of the compressed data received from the transmission apparatus 110.

Here, the reference bit(s) included in the compressed data may be compared with the reference bit(s) of each sample type included in the sample type determination rule, whereby the sample type may be determined.

Here, the compressed data may include the reference bit(s), a sign bit, and a compressed bit string corresponding to an IQ data sample in the order in which they are listed.

Also, the reception apparatus 120 reconstructs the IQ data sample corresponding to the compressed data based on a compression rule pertaining to the sample type.

Here, the number of deleted upper bits and the number of deleted lower bits are detected based on the compression rule, as many bits as the number of deleted upper bits may be reconstructed before the compressed bit string depending on whether the preset type is a positive number or a negative number, and a random value corresponding to the number of deleted lower bits may be generated and used to reconstruct bits after the compressed bit string.

Also, the reception apparatus 120 performs a two's complement operation on the reconstructed IQ data sample based on the sign bit included in the compressed data, thereby correcting the IQ data sample.

Here, when the value of the sign bit corresponds to the preset type, the bits of the reconstructed IQ data sample may be converted according to a two's complement operation.

Also, the reception apparatus 120 receives at least one of the compression rule and the sample type determination rule for determining the sample type from the transmission apparatus 110.

The network 130 provides a channel via which compressed data is transmitted between the transmission apparatus 110 and the reception apparatus 120, and may be conceptually understood as including networks that are currently being used and networks that have yet to be developed. For example, the network 130 may be any one of wired and wireless local networks for providing communication between various kinds of data devices in a limited area, a mobile communication network for providing communication between mobile devices or between a mobile device and the outside thereof, a satellite network for providing communication between earth stations using a satellite, and a wired/wireless communication network, or may be a combination of two or more selected therefrom. Meanwhile, a transmission protocol standard for the network 130 is not limited to existing transmission protocol standards, but may include all transmission protocol standards to be developed in the future.

Figure 2:
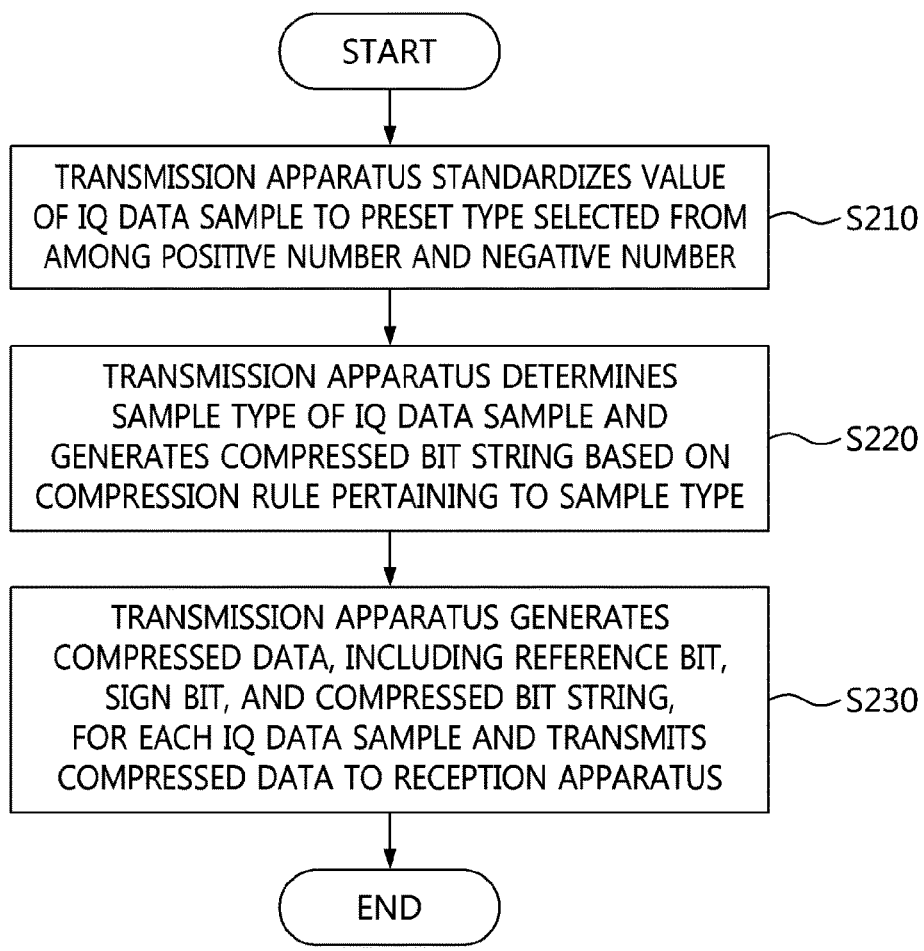
FIG. 2 is a flowchart that shows a method for transmitting compressed data according to an embodiment of the present invention.

FIG. 2 is a flowchart that shows a method for transmitting compressed data according to an embodiment of the present invention.

Referring to FIG. 2, in the method for transmitting compressed data according to an embodiment of the present invention, a transmission apparatus, which will transmit compressed data, standardizes the values of IQ data samples to a preset type that is selected from among a positive number and a negative number at step S210.

In a compression block formed according to a general block-scaling method, each data sample therein may be represented as a bit string in which the number of bits containing meaningful data varies.

For example, FIG. 3 shows the types of samples that may be included in a single compression block. Here, assuming that a single sample consists of 16 bits, and that a single compression block consists of 32 samples, 16 types of samples may be randomly or repeatedly arranged in a single compression block, as shown in FIG. 3.

Here, the number of valid bits (Sv) 310 may be the number of valid bits of signal information included in each sample. For example, if the number of valid bits 310 is 2, the sampled signal information may be represented as 2 bits including a sign bit. If the number of valid bits 310 is 16, the sampled signal information may be represented as 16 bits including a sign bit.

Here, the valid bits 320, in which the value representing signal information is stored, may be bits that are required in order to represent the value of each sample.

Also, dummy bits 330 are bits that do not affect the value of each sample, and may be sign extension bits.

For example, in the IQ data sample 311 illustrated in FIG. 3, $b_9$ is a sign bit, bits from $b_0$ to $b_8$ contain signal information, and bits from $b_{10}$ to $b_{15}$ may be sign extension bits, each of which has the same value as the value of the sign bit.

Accordingly, the transmission apparatus according to an embodiment of the present invention may transmit a signal after it compresses data based on the 16 types of IQ data samples shown in FIG. 3.

Assume that the ten IQ data samples illustrated in FIG. 4 are input to the transmission apparatus according to an embodiment of the present invention. Here, the bit marked with a grid in each IQ data sample may be a sign bit 410. Also, the bits following the sign bit 410, which are marked with diagonal lines, may be valid bits 420 containing meaningful data. Also, the bits preceding the sign bit 410, which are marked with white boxes, may be sign extension bits, and may thus be a meaningless part.

Here, when compression is performed in units of blocks based on the maximum number of valid bits in a block according to a block-scaling method, IQ data samples are compressed such that each IQ data sample includes only a fixed number of bits from $b_{15}$, as shown in FIG. 4.

For example, when compression is performed at a compression ratio of 50% such that each data sample has 8 bits, only the bits included in the compressed bit strings 430 of length 8, shown in FIG. 4, are transmitted to the reception apparatus. Accordingly, in the case of the sixth IQ data sample, all of its meaningful data is deleted. That is, because the IQ data samples corresponding to ①, ④, ⑥ and ⑩ lose most of their valid bits 420, an error vector magnitude (EVM) is increased after a reception apparatus reconstructs a signal.

Therefore, even though a compression ratio is decreased, the range of bits to be transmitted may be extended so as to transmit a compressed bit string 440 of length 10 in order to more accurately reconstruct the data.

However, when the data compression method illustrated in FIG. 4 is used, it is required to wait for the input of a fixed number of IQ data samples in order to form a compression block, which may cause transmission delay. Also, in order to avoid the loss of upper bits, which causes serious distortion of signal information, many bits are deleted from lower bits, whereby meaningful data may be lost.

Accordingly, the present invention intends to provide a data compression method that may prevent transmission delay and transmit a greater number of valid bits.

To this end, the present invention may convert the bits of an input IQ data sample according to a two's complement operation when the value thereof does not correspond to a preset type.

For example, when the preset type is a positive number and when the value of the IQ data sample is negative, the bits thereof are converted according to a two's complement operation, whereby the value of the IQ data sample may be converted to a positive number.

Here, whether the value of an IQ data sample is positive or negative may be determined based on the sign bit thereof. For example, when the sign bit is '0', the value of the IQ data sample may be determined to be positive, but when the sign bit is '1', the value thereof may be determined to be negative.

To this end, the present invention may extract the sign bit of an IQ data sample and manage the same separately. Here, based on the location of the sign bit, valid bits may be separated from dummy bits.

Also, in the present invention, whether the value of an IQ data sample is positive or negative may be determined depending on the leftmost bit thereof. For example, the leftmost bit of an IQ data sample may be a sign bit or a sign extension bit. Here, the sign extension bits are dummy bits that precede the sign bit, and the value of each of the sign extension bits may be the same as the value of the sign bit.

Accordingly, when the leftmost bit of an IQ data sample is '0', the value of the IQ data sample may be determined to be positive. Conversely, when the leftmost bit of the IQ data sample is '1', the value of the IQ data sample may be determined to be negative.

For example, when the value of each of the ten IQ data samples shown in FIG. 4 becomes a positive number, the values may be converted as shown in FIG. 5. When FIG. 4 is compared with FIG. 5, it is confirmed that the bits of the IQ data samples corresponding to ①, ②, ③, ⑥, ⑦, ⑨ and ⑩ are converted according to a two's complement operation.

In another example, when the value of each of the IQ data samples shown in FIG. 4 becomes a negative number, although not illustrated in the drawing, the bits of the IQ data samples corresponding to ④, ⑤ and ⑧ may be converted according to a two's complement operation.

As described above, the values of all of the IQ data samples, which are input to generate compressed data, are standardized to the preset type, whereby the sign bits thereof and the sign extension bits preceding the sign bits may have the same value. Accordingly, when a compression algorithm is applied, compression efficiency may be improved.

Here, the preset type may be set or changed by a system administrator.

Also, in the method for transmitting compressed data according to an embodiment of the present invention, the transmission apparatus determines the sample type of the IQ data sample depending on a sample type determination rule and generates a compressed bit string based on a compression rule pertaining to the determined sample type at step S220.

Here, regardless of the sample type, the leftmost bit of the IQ data sample, the value of which is standardized to the preset type, may be truncated.

For example, referring to FIG. 5, because all of the sign bits 510 and the sign extension bits are converted to '0' through a two's complement operation, the value of $b_{16}$ in each of the ten IQ data samples is definitely '0'. Therefore, the bit $b_{16}$ is excluded from the data to be transmitted, but information thereabout is delivered such that the reception apparatus restores $b_{16}$ to '0', whereby the effect of increasing a compression ratio may be generated.

Also, although not illustrated in FIG. 2, in the method for transmitting compressed data according to an embodiment of the present invention, the transmission apparatus may extract a sign bit from an IQ data sample before it performs a two's complement operation thereon, and may store the extracted bit as information for generating compressed data.

For example, referring to FIG. 6, the sign bits 610 of the IQ data samples may be extracted from the IQ data samples at the step shown in FIG. 4 and stored separately from the IQ data samples shown in FIG. 6. Here, the sign bits included in the IQ data samples shown in FIG. 6 may be processed in the same manner as general data bits. Accordingly, the sign bits 510 that are fixed to '0' through a two's complement operation as shown in FIG. 5 are regarded as general data bits in FIG. 6.

Here, the bits marked with diagonal lines in FIG. 6 are valid bits 620 containing meaningful data, and the remaining bits, excluding the valid bits 620, are dummy bits that do not contain meaningful data.

Also, referring to FIG. 6, it is confirmed that all of the dummy bits, excluding the valid bits 620, are fixed to '0' through a two's complement operation. If the preset type is a negative number, all of the dummy bits may be fixed to '1'. That is, when IQ data samples are converted as shown in FIG. 6, bits that precede the first '1' in a data sample may be regarded as dummy bits regardless of the sign bit, and may be included in the bits to be deleted.

Accordingly, although the sign bit 610 of each of the IQ data samples corresponding to ①, ②, ③, ⑥, ⑦, ⑨ and ⑩ is '1' in FIG. 6, bits from the leftmost bit to the sign bit may be truncated. Also, in the case of other samples classified as the same type as the IQ data samples corresponding to ①, ②, ③, ⑥, ⑦, ⑨ and ⑩, one more bits may also be deleted along with the dummy bits thereof, whereby the effect of increasing a compression ratio may be provided.

Also, although not illustrated in FIG. 2, in the method for transmitting compressed data according to an embodiment of the present invention, the transmission apparatus may set two or more sample types corresponding to the sample type determination rule in consideration of distribution of the valid bits of multiple IQ data samples input to the transmission apparatus.

Here, the process of setting a sample type determination rule based on the sample type is a preprocessing process for performing compression, and may be the process of analyzing multiple IQ data samples input to the transmission apparatus and detecting the types thereof and the proportions of data samples corresponding to the respective types.

For example, depending on the strength of signals transmitted by a device for transmitting analog signals, the values of pieces of data quantized to 16 bits may be determined. Then, the distribution of these values is analyzed, whereby the number of types into which the IQ data samples are categorized may be determined.

Figure 7:
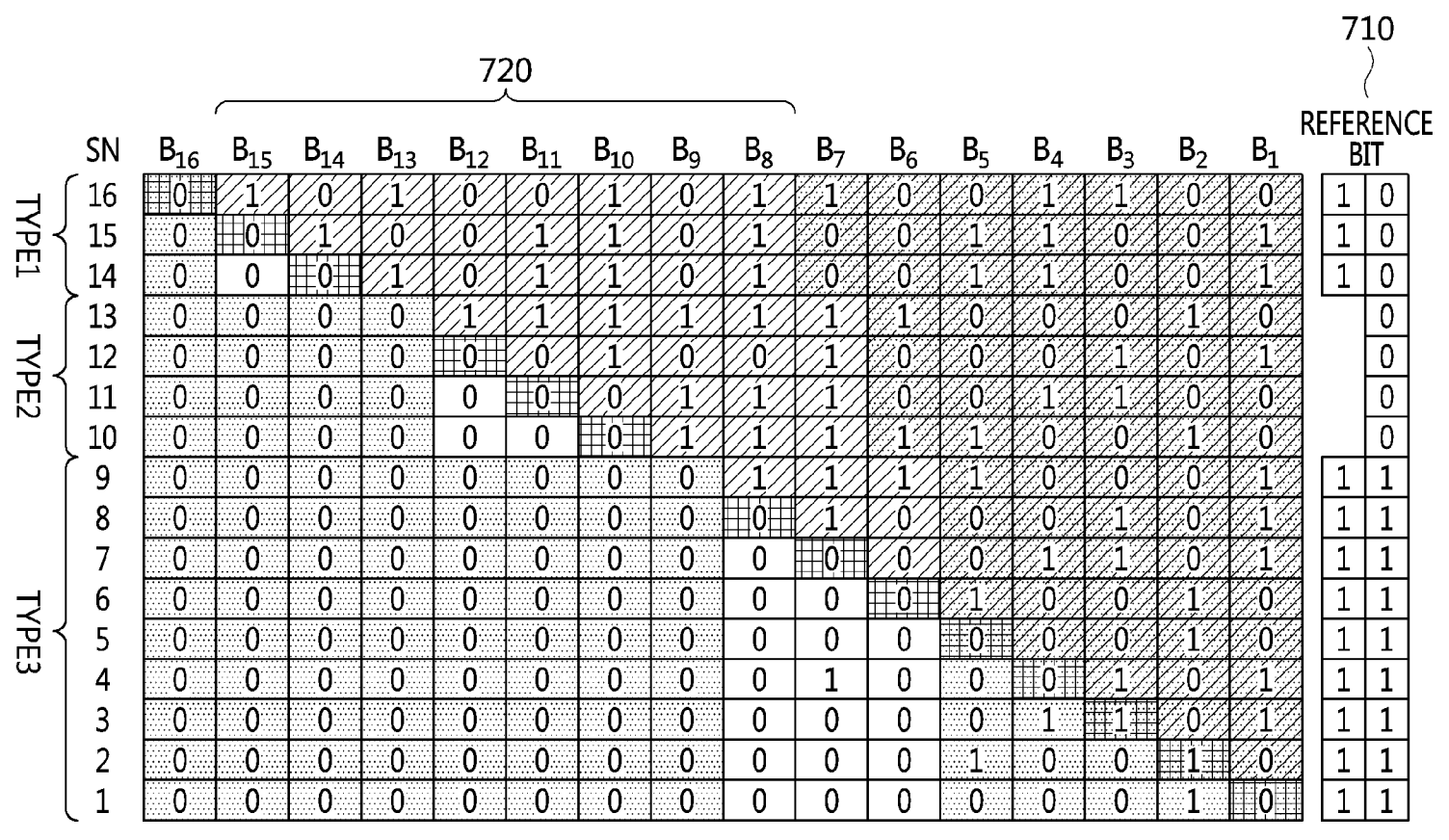

For example, as illustrated in FIG. 7, when the leftmost four bits ($b_{16}$ to $b_{13}$) of a sample are not equal to '0000' ($b_{16}$~$b_{13}$!='0000'), the sample may be classified as Type 1. When the leftmost four bits are equal to '0000' and the next four bits are not equal to '0000' ($b_{16}$~$b_{13}$=='0000' and $b_{12}$~$b_9$!='0000'), the sample may be classified as Type 2. When all of the leftmost four bits and the next four bits are equal to '0000' ($b_{16}$~$b_{13}$=='0000' and $b_{12}$~$b_9$=='0000'), the sample may be classified as Type 3.

Here, when the sample type is determined, because the identifier of each sample type must be transmitted to the reception apparatus for each IQ data sample, a compression ratio may be decreased as the number of sample types is increased. Therefore, the number of sample types may be appropriately set in consideration of a compression ratio and an EVM at which the system is targeted.

Also, although not illustrated in FIG. 2, in the method for transmitting compressed data according to an embodiment of the present invention, a compression rule for each sample type, which includes parameter information corresponding to bits to be deleted, may be generated.

Here, the bits to be deleted may be divided into upper bits and lower bits as shown in Table 1 and stored as parameter information.

TABLE 1

| type | the number of upper bits to be deleted | the number of lower bits to be deleted |
| --- | --- | --- |
| Type 1 | N1 | M1 |
| Type 2 | N2 | M2 |
| Type 3 | N3 | M3 |

Also, although not illustrated in FIG. 2, in the method for transmitting compressed data according to an embodiment of the present invention, the transmission apparatus may share at least one of the sample type determination rule and the compression rule with the reception apparatus.

Here, the reception apparatus may reconstruct the compressed data received from the transmission apparatus using the sample type determination rule and the compression rule.

Therefore, the transmission apparatus may share information about the sample type determination rule and the compression rule with the reception apparatus through a separate process before it generates compressed data.

Here, an IQ data sample may be divided into multiple groups of preset N bits based on the sample type determination rule, and the sample type may be determined depending on the value of at least one of the leftmost N bits and N bits following the leftmost N bits.

For example, bits of each of the ten IQ data samples illustrated in FIG. 6 are divided into multiple groups of four bits depending on the sample type determination rule set in FIG. 7, and the sample type may be determined depending on whether or not the divided four bits are equal to '0000'. For the ten IQ data samples illustrated in FIG. 6, when the leftmost four bits from $b_{16}$ to $b_{13}$ are not equal to '0000' ($b_{16}$~$b_{13}$!='0000'), the corresponding IQ data sample may be determined to be Type 1. Also, when the leftmost four bits are equal to '0000' but the next four bits are not equal to '0000' ($b_{16}$~$b_{13}$=='0000' and $b_{12}$~$b_9$!='0000'), the corresponding IQ data sample may be determined to be Type 2. Also, when all of the leftmost four bits and the next four bits are equal to '0000' ($b_{16}$~$b_{13}$=='0000' and $b_{12}$~$b_9$=='0000'), the corresponding IQ data sample may be determined to be Type 3.

Then, based on the compression rule pertaining to the determined sample type, the target bits to be deleted are deleted from the IQ data sample, whereby data may be compressed.

For example, when the bits represented as being shaded in FIG. 7 are the target bits to be deleted, it may be determined that the compression rule shown in Table 2 is applied.

TABLE 2

| type | the number of upper bits to be deleted | the number of lower bits to be deleted |
|---|---|---|
| Type 1 | 1 | 7 |
| Type 2 | 4 | 6 |
| Type 3 | 8 | 5 |

That is, according to Table 2, when the IQ data sample corresponds to Type 1, a single bit $b_{16}$, which is a sign bit or a sign extension bit, is deleted from the upper bits, and seven bits from $b_1$ to $b_7$ are deleted from the lower bits, whereby a compressed bit string may be generated. Also, when the IQ data sample corresponds to Type 2, four bits from $b_{16}$ to $b_{13}$ are deleted from the upper bits, and six bits from $b_1$ to $b_6$ are deleted from the lower bits, whereby a compressed bit string may be generated. Also, when the IQ data sample corresponds to Type 3, eight bits from $b_{16}$ to $b_9$ are deleted from the upper bits, and five bits from $b_1$ to $b_5$ are deleted from the lower bits, whereby a compressed bit string may be generated.

Here, the bits that are represented as not being shaded in FIG. 7 may be a compressed bit string, and the compressed bit string may be the data that is actually transmitted in the entire bit string of the IQ data sample.

Also, in the method for transmitting compressed data according to an embodiment of the present invention, the transmission apparatus generates compressed data, including at least one of a reference bit (or reference bits) corresponding to a sample type, the sign bit of the IQ data sample, and the compressed bit string, for each IQ data sample and transmits the compressed data to the reception apparatus at step S230. That is, in the present invention, compressed data may be generated and transmitted in units of IQ data samples without forming a block, whereby transmission delay may be prevented.

Figure 8:
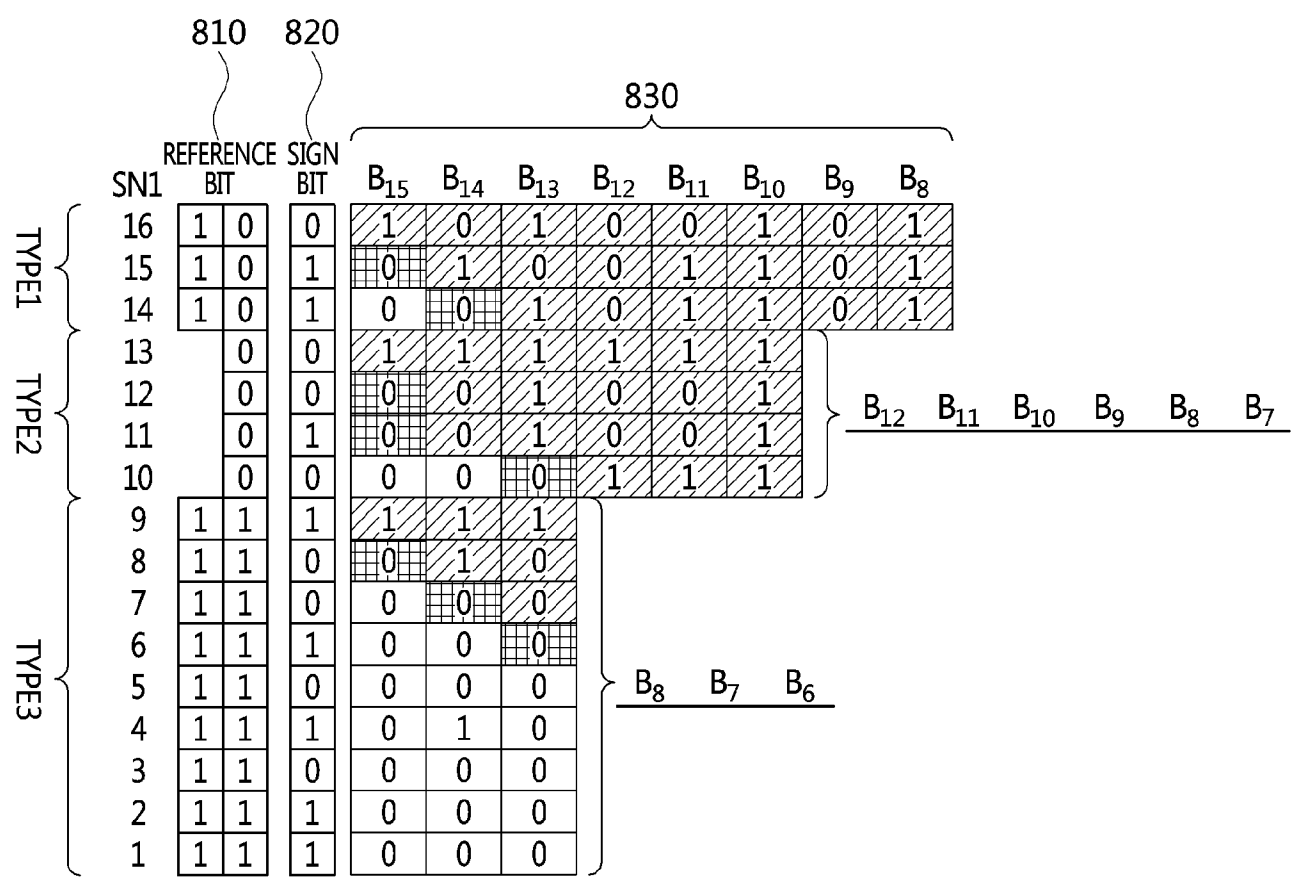

For example, referring to FIG. 8, compressed data for each sample type may be configured such that the leftmost one bit or the leftmost two bits is (are) a reference bit or reference bits, the next one bit is the sign bit of the original value of the corresponding IQ data sample, and the next N bits are the compressed bit string to be transmitted.

Here, the reference bit(s) may represent the sample type of the IQ data sample. However, because the reference bit(s) transmitted along with the compressed data may decrease a compression ratio, it is desirable to use as few bits as possible.

Accordingly, one reference bit may be allocated in order to indicate any one sample type that accounts for the greatest proportion, among two or more sample types, and at least two reference bits may be allocated in order to indicate the remaining sample types. Accordingly, the effect of the reference bit(s) on the compression ratio may be minimized. For example, when the signals in FIG. 6 are analyzed, the proportions of the IQ data samples classified as the respective sample types may be represented as 'Type 2>Type 1>Type 3'. Accordingly, one reference bit 710 may be allocated in order to indicate Type 2, and two reference bits 710 may be allocated in order to indicate Type 1 and Type 3.

Here, referring to FIG. 7, because the bit $b_{16}$ is deleted from the IQ data sample corresponding to Type 1, one more dummy bit may be deleted when a compressed bit string is generated. According to the conventional block-scaling method, because all of the samples must retain their sign bits, $b_{16}$ cannot be deleted. That is, even in the case of IQ data samples of which the number of valid bits (Sn) is 15 or 14, the meaningless bit $b_{16}$ must be transmitted.

As shown in FIG. 8, the present invention separately transmits the sign bit 820, whereby additional data transmission load may not be imposed. Furthermore, in the case of other types of IQ data samples, sign bits are further deleted, whereby a higher compression ratio may be achieved than when using another compression algorithm.

Also, although not illustrated in FIG. 2, in the method for transmitting compressed data according to an embodiment of the present invention, various kinds of information that is generated in the above-described process of transmitting compressed data may be stored in a separate storage module.

As described above, when compressed data is transmitted through the above-described method for transmitting compressed data, compression efficiency may be improved, and signal transmission delay that may be caused due to IQ data compression may be reduced.

Figure 9:
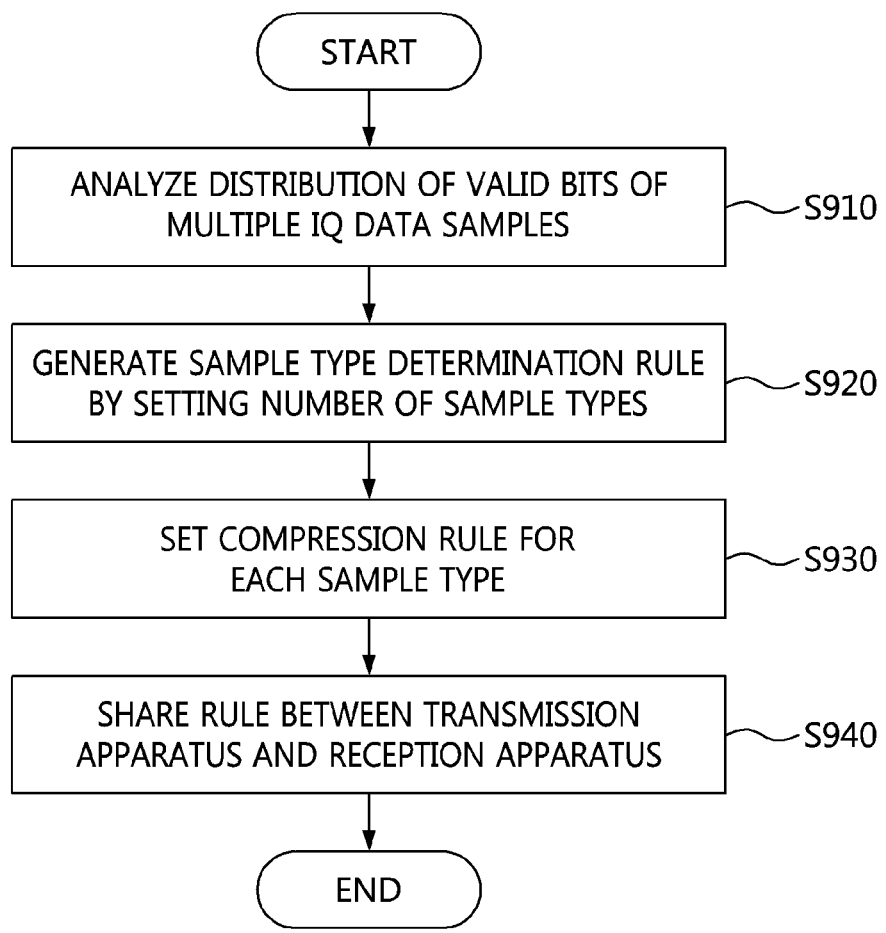
FIG. 9 is a flowchart that shows the process of sharing information about a rule between a transmission apparatus and a reception apparatus in order to transmit and receive data according to an embodiment of the present invention.

FIG. 9 is a flowchart that shows the process of sharing rule information between a transmission apparatus and a reception apparatus in order to transmit and receive data according to an embodiment of the present invention.

Referring to FIG. 9, in the process of sharing rule information between a transmission apparatus and a reception apparatus according to an embodiment of the present invention, first, the transmission apparatus analyzes distribution of the valid bits of multiple IQ data samples at step S910.

Here, the values of pieces of data quantized to 16 bits may be determined depending on the strength of signals transmitted by a device for transmitting analog signals. Then, the distribution of these values is analyzed, whereby the distribution of valid bits may be interpreted.

Then, the transmission apparatus sets the number of sample types and generates a sample type determination rule at step S920.

Here, when sample types are set, because the identifier of each sample type must be transmitted to a reception apparatus for each IQ data sample, a compression ratio may be decreased as the number of sample types is increased. Therefore, the number of sample types may be appropriately set in consideration of the compression ratio and the EVM at which the system is targeted.

Then, the transmission apparatus sets a compression rule for each sample type at step S930.

Here, the compression rule may include parameter information for the target bits to be deleted from an IQ data sample corresponding to each sample type. For example, the parameter information for the target bits to be deleted may be information about the number of upper bits to be deleted and the number of lower bits to be deleted based on a compressed bit string included in the compressed data.

Then, the transmission apparatus transmits the sample type determination rule and the compression rule to the reception apparatus, whereby the rule information may be shared between the two apparatuses at step S940.

Here, the rule information may be shared between the transmission apparatus and the reception apparatus before the transmission apparatus generates compressed data.

Figure 10:
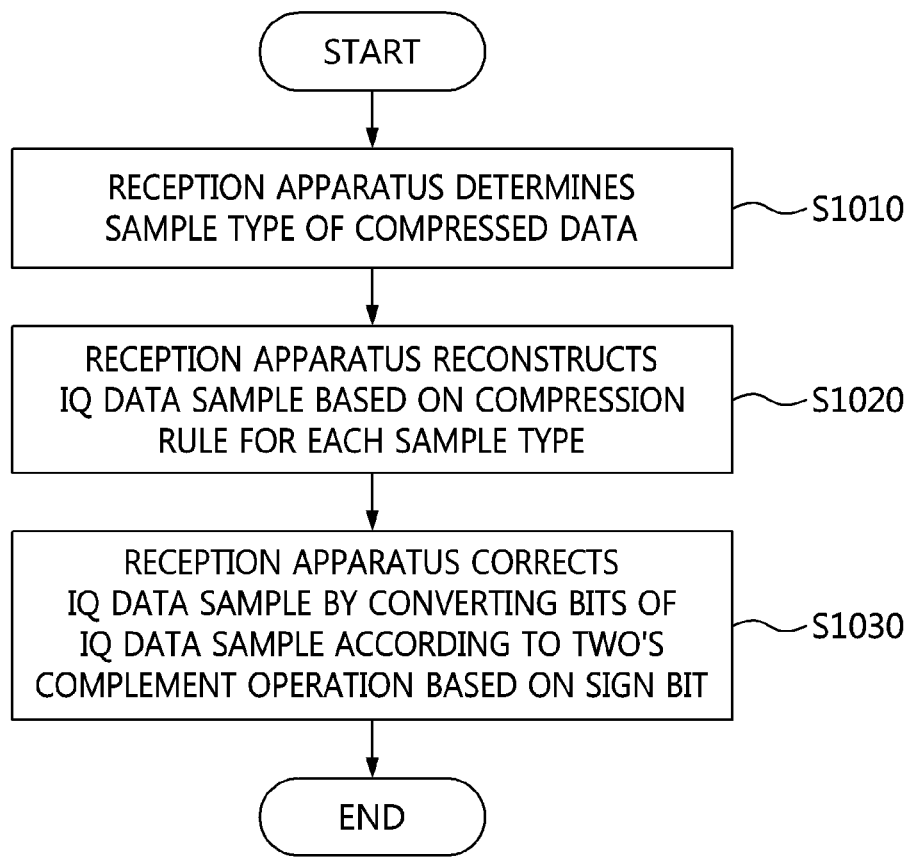
FIG. 10 is a flowchart that shows a method for receiving compressed data according to an embodiment of the present invention.

FIG. 10 is a flowchart that shows a method for receiving compressed data according to an embodiment of the present invention.

Referring to FIG. 10, in the method for receiving compressed data according to an embodiment of the present invention, a reception apparatus determines the sample type of the compressed data received from a transmission apparatus at step S1010.

Here, the compressed data may include a reference bit (or reference bits), a sign bit, and a bit string corresponding to an IQ data sample in the order in which they are listed.

Here, the reference bit(s) is (are) for determining the sample type of the compressed data, and the sample type may be determined by checking the reference bit(s) based on the sample type determination rule shared with the transmission apparatus.

That is, the reference bit(s) included in the compressed data is (are) compared with a reference bit (or reference bits) for each sample type, which is included in the sample type determination rule, whereby the sample type may be determined.

Here, although not illustrated in FIG. 10, in the method for receiving compressed data according to an embodiment of the present invention, the reception apparatus may receive at least one of the sample type determination rule for determining the sample type and a compression rule from the transmission apparatus.

Here, the sample type and the reference bit(s) corresponding thereto may be acquired from the sample type determination rule, and parameter information for a compression rule may be acquired.

If the sample type determination rule corresponds to the reference bit(s) and the sample types illustrated in FIG. 8, when the reference bits are equal to '10', the sample type of the compressed data may be determined to be Type 1.

Here, because the reference bit(s) is (are) foremost in the compressed data, the sample type of the compressed data may be determined by checking the first bit or the first two bits thereof. Also, the number of reference bits may be equal to or greater than three depending on the number of sample types included in the sample type determination rule.

Also, in the method for receiving compressed data according to an embodiment of the present invention, the reception apparatus reconstructs the IQ data sample corresponding to the compressed data based on the compression rule pertaining to the determined sample type at step S1020. That is, the process of reconstructing the IQ data sample, which was 16 bits before it is compressed by the transmission apparatus, may be performed.

Here, the number of deleted upper bits and the number of deleted lower bits may be detected based on the compression rule. Here, using parameter information about the target bits to be deleted from each sample type in the compression rule, the number of deleted upper bits and the number of deleted lower bits may detected.

Here, as many bits as the number of deleted upper bits may be reconstructed before the compressed bit string included in the compressed data in consideration of a preset type, which is a positive number or a negative number. For example, if the preset type is a positive number, as many '0's as the number of deleted upper bits may be generated before the compressed bit string in consideration of a two's complement operation that was performed in the transmission apparatus.

Here, a random value corresponding to the number of deleted lower bits is generated, and the generated random value may be used to reconstruct bits after the compressed bit string.

Here, all of the bits reconstructed after the compressed bit string may be set to '0' or '1'.

Alternatively, the bits to be reconstructed after the compressed bit string may be determined based on Equation (1), whereby the system may acquire optimal performance.

$$2^{(\text{the number of bits to be reconstructed}-1)} \quad (1)$$

For example, when the number of deleted lower bits is four, the bits may be reconstructed so as to be $2^3$.

Also, in the method for receiving compressed data according to an embodiment of the present invention, the reception apparatus corrects the IQ data sample by performing a two's complement operation thereon based on the sign bit included in the compressed data at step S1030.

Here, when the value of the sign bit corresponds to the preset type, the bits of the reconstructed IQ data sample may be converted according to a two's complement operation.

For example, when the preset type is a positive number, the bits of the reconstructed IQ data sample, the sign bit of which is 1, may be converted according to a two's complement operation.

The IQ data sample reconstructed through steps 1010 to 1030 may be delivered to a high-level module, and the reception apparatus according to an embodiment of the present invention may receive the next compressed data and repeatedly perform the process of reconstructing the IQ data sample.

Figure 11:
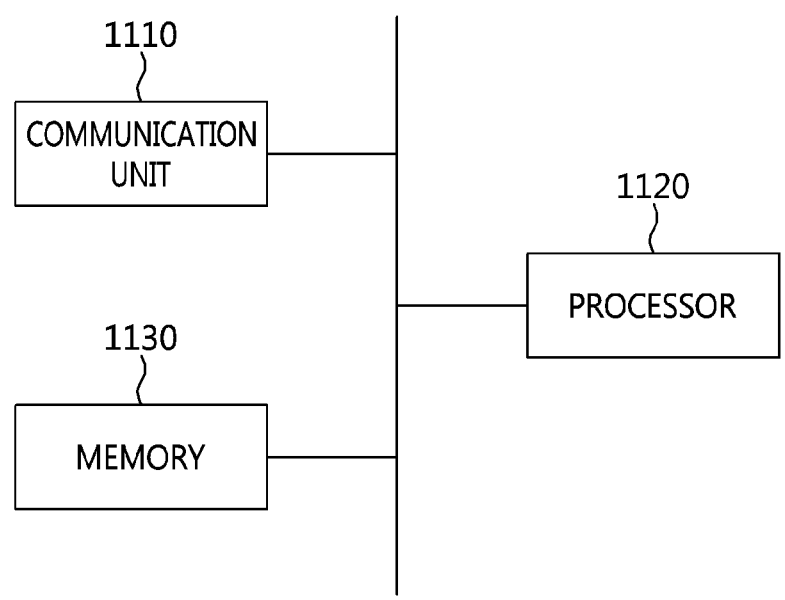
FIG. 11 is a block diagram that show a transmission apparatus according to an embodiment of the present invention.

FIG. 11 is a block diagram that shows a transmission apparatus according to an embodiment of the present invention.

Referring to FIG. 11, the transmission apparatus according to an embodiment of the present invention includes a communication unit 1110, a processor 1120, and memory 1130.

The communication unit 1110 functions to transmit and receive information that is necessary in order to transmit compressed data according to an embodiment of the present invention. Particularly, the communication unit 1110 according to the present invention may receive an IQ data sample and transmit compressed data to a reception apparatus.

The processor 1120 standardizes the values of IQ data samples to a preset type that is selected from among a positive number and a negative number.

In a compression block formed according to a general block-scaling method, each data sample therein may be represented as a bit string in which the number of bits containing meaningful data varies.

For example, FIG. 3 shows the types of samples that may be included in a single compression block. Here, assuming that a single sample consists of 16 bits, and that a single compression block consists of 32 samples, 16 types of samples may be randomly or repeatedly arranged in a single compression block, as shown in FIG. 3.

Here, the number of valid bits (Sv) 310 may be the number of valid bits of signal information included in each sample. For example, if the number of valid bits 310 is 2, the sampled signal information may be represented as 2 bits including a sign bit. If the number of valid bits 310 is 16, the sampled signal information may be represented as 16 bits including a sign bit.

Here, the valid bits 320, which contain a value that represents signal information, may be the bits that are required in order to represent the value of each sample.

Also, dummy bits 330 are the bits that do not affect the value of each sample, and may be sign extension bits.

For example, in the IQ data sample 311 illustrated in FIG. 3, $b_9$ is a sign bit, bits from $b_0$ to $b_8$ contain signal information, and bits from $b_{10}$ to $b_{15}$ may be sign extension bits, each of which has the same value as the value of the sign bit.

Accordingly, the transmission apparatus according to an embodiment of the present invention may transmit a signal after it compresses data based on the 16 types of IQ data samples, shown in FIG. 3.

Assume that the ten IQ data samples illustrated in FIG. 4 are input to the transmission apparatus according to an embodiment of the present invention. Here, the bit marked with a grid in each IQ data sample may be a sign bit 410. Also, the bits following the sign bit 410, which are marked with diagonal lines, may be valid bits 420 containing meaningful data. Also, the bits preceding the sign bit 410, which are marked with white boxes, may be sign extension bits, and may thus be a meaningless part.

Here, when compression is performed in units of blocks based on the maximum number of valid bits in a block according to a block-scaling method, IQ data samples are compressed such that each IQ data sample includes only a fixed number of bits from the bit $b_{15}$, as shown in FIG. 4.

For example, when compression is performed at a compression ratio of 50% such that each data sample has 8 bits, only the bits included in the compressed bit strings 430 of length 8, illustrated in FIG. 4, are transmitted to the reception apparatus. Accordingly, in the case of the sixth IQ data sample, all of its meaningful data is deleted. That is, because the IQ data samples corresponding to ①, ④, ⑥ and ⑩ lose most of their valid bits 420, an error vector magnitude (EVM) increases after a reception apparatus reconstructs a signal.

Therefore, even though a compression ratio is decreased, the range of bits to be transmitted may be extended so as to transmit a compressed bit string 440 of length 10 in order to more accurately reconstruct the data.

However, when the data compression method illustrated in FIG. 4 is used, it is required to wait for the input of a fixed number of IQ data samples in order to form a compression block, which may cause transmission delay. Also, in order to avoid the loss of upper bits, which causes serious distortion of signal information, many bits are deleted from lower bits, whereby meaningful data may be lost.

Accordingly, the present invention intends to provide a data compression method that may prevent transmission delay and transmit a greater number of valid bits.

To this end, the present invention may convert the bits of an input IQ data sample according to a two's complement operation when the value thereof does not correspond to a preset type.

For example, when the preset type is a positive number and when the value of the IQ data sample is negative, the bits thereof are converted according to a two's complement operation, whereby the value of the IQ data sample may be converted to a positive number.

Here, whether the value of an IQ data sample is positive or negative may be determined based on the sign bit thereof. For example, when the sign bit is '0', the value of the IQ data sample may be determined to be positive, but when the sign bit is '1', the value thereof may be determined to be negative.

To this end, the present invention may extract the sign bit of an IQ data sample and manage the same separately. Here, based on the location of the sign bit, valid bits may be separated from dummy bits.

Also, in the present invention, whether the value of an IQ data sample is positive or negative may be determined depending on the leftmost bit thereof. For example, the leftmost bit of an IQ data sample may be a sign bit or a sign extension bit. Here, the sign extension bits are dummy bits that precede the sign bit, and the value of each of the sign extension bits may be the same as the value of the sign bit.

Accordingly, when the leftmost bit of an IQ data sample is '0', the value of the IQ data sample may be determined to be positive. Conversely, when the leftmost bit of the IQ data sample is '1', the value of the IQ data sample may be determined to be negative.

For example, when the value of each of the ten IQ data samples shown in FIG. 4 becomes a positive number, the values may be converted as shown in FIG. 5. When FIG. 4 is compared with FIG. 5, it is confirmed that the bits of the IQ data samples corresponding to ①, ②, ③, ⑥, ⑦, ⑨ and ⑩ are converted according to a two's complement operation.

In another example, when the value of each of the IQ data samples shown in FIG. 4 becomes a negative number, although not illustrated in the drawing, the bits of the IQ data samples corresponding to ④, ⑤ and ⑧ may be converted according to a two's complement operation.

As described above, the values of all of the IQ data samples, which are input in order to generate compressed data, are standardized to the preset type, whereby the sign bits thereof and the sign extension bits preceding the sign bits may have the same value. Accordingly, when a compression algorithm is applied, compression efficiency may be improved.

Here, the preset type may be set or changed by a system administrator.

Also, the processor 1120 determines the sample type of the IQ data sample, the value of which is standardized to the preset type, depending on a sample type determination rule, and generates a compressed bit string based on a compression rule pertaining to the determined sample type.

Here, regardless of the sample type, the leftmost bit of the IQ data sample, the value of which is standardized to the preset type, may be truncated.

For example, referring to FIG. 5, because all of the sign bits 510 and the sign extension bits are converted to '0' through a two's complement operation, the value of $b_{16}$ in each of the ten IQ data samples is definitely '0'. Therefore, the bit $b_{16}$ is excluded from the data to be transmitted, but information thereabout is delivered such that the reception apparatus restores the bit $b_{16}$ to '0', whereby the effect of increasing a compression ratio may be generated.

Also, the processor 1120 may extract a sign bit from an IQ data sample before it performs a two's complement operation thereon and store the extracted sign bit as information for generating compressed data.

For example, referring to FIG. 6, the sign bits 610 of the IQ data samples may be extracted from the IQ data samples at the step shown in FIG. 4 and stored separately from the IQ data samples shown in FIG. 6. Here, the sign bits included in the IQ data samples shown in FIG. 6 may be processed in the same manner as general data bits. Accordingly, the sign bits 510 that are fixed to '0' through a two's complement operation as shown in FIG. 5 are regarded as general data bits in FIG. 6.

Here, the bits marked with diagonal lines in FIG. 6 are valid bits 620 containing meaningful data, and the remaining bits, excluding the valid bits 620, are dummy bits that do not contain meaningful data.

Also, referring to FIG. 6, it is confirmed that the values of all of the dummy bits, excluding the valid bits 620, are fixed to '0' through a two's complement operation. If the preset type is a negative number, the values of all of the dummy bits may be fixed to '1'. That is, when IQ data samples are converted as shown in FIG. 6, bits that precede the first '1' in a data sample may be regarded as dummy bits regardless of the sign bit, and may be included in the bits to be deleted.

Accordingly, although the sign bit 610 of each of the IQ data samples corresponding to ①, ④, ⑥ and ⑩ is '1' in FIG. 6, bits from the leftmost bit to the sign bit may be truncated. Also, in the case of other samples classified as the same type as the IQ data samples corresponding to ①, ④, ⑥ and ⑩, one more bit may also be deleted along with the dummy bits, whereby the effect of increasing a compression ratio may be provided.

Also, the processor 1120 may set two or more sample types corresponding to the sample type determination rule in consideration of the distribution of the valid bits of multiple IQ data samples input to the transmission apparatus.

Here, the process of setting a sample type determination rule based on the sample type is a preprocessing process for performing compression, and may be the process of analyzing multiple IQ data samples input to the transmission apparatus and detecting the types thereof and the proportions of IQ data samples corresponding to the respective types.

For example, depending on the strength of signals transmitted by a device for transmitting analog signals, the values of pieces of data quantized to 16 bits may be determined. Then, the distribution of these values is analyzed, whereby the number of types into which the IQ data samples are categorized may be determined.

For example, as illustrated in FIG. 7, when the leftmost four bits ($b_{16}$ to $b_{13}$) of a sample are not equal to '0000' ($b_{16} \sim b_{13}$ !='0000'), the sample may be classified as Type 1. When the leftmost four bits are equal to '0000' but the next four bits are not equal to '0000' ($b_{16} \sim b_{13}$=='0000' and $b_{12} \sim b_9$ !='0000'), the sample may be classified as Type 2. When all of the leftmost four bits and the next four bits are equal to '0000' ($b_{16} \sim b_{13}$=='0000' and $b_{12} \sim b_9$=='0000'), the sample may be classified as Type 3.

Here, when the sample type is determined, because the identifier of each type must be transmitted to the reception apparatus for each IQ data sample, the compression ratio may be decreased as the number of sample types is increased. Therefore, the number of sample types may be appropriately set in consideration of the compression ratio and the EVM at which the system is targeted.

Also, the processor 1120 may generate a compression rule for each sample type, which includes parameter information corresponding to the bits to be deleted.

Here, the bits to be deleted may be divided into upper bits and lower bits as shown in Table 1 and stored as parameter information.

Also, the processor 1120 may share at least one of the sample type determination rule and the compression rule with the reception apparatus.

Here, the reception apparatus may reconstruct the compressed data received from the transmission apparatus using the sample type determination rule and the compression rule.

Therefore, the transmission apparatus may share information about the sample type determination rule and the compression rule with the reception apparatus through a separate process before it generates compressed data.

Here, an IQ data sample may be divided into multiple groups of preset N bits based on the sample type determination rule, and the sample type may be determined depending on the value of at least one of the leftmost N bits and N bits following the leftmost N bits.

For example, bits of each of the ten IQ data samples illustrated in FIG. 6 are divided into multiple groups of four bits depending on the sample type determination rule set in FIG. 7, and the sample type may be determined depending on whether or not the divided four bits are equal to '0000'. For the ten IQ data samples illustrated in FIG. 6, when the leftmost four bits from $b_{16}$ to $b_{13}$ are not equal to '0000' ($b_{16} \sim b_{13}$!='0000'), the corresponding IQ data sample may be determined to be Type 1. Also, when the leftmost four bits are equal to '0000' but the next four bits are not equal to '0000' ($b_{16} \sim b_{13}$=='0000' and $b_{12} \sim b_9$ !='0000'), the corresponding IQ data sample may be determined to be Type 2. Also, when all of the leftmost four bits and the next four bits are equal to '0000' ($b_{16} \sim b_{13}$=='0000' and $b_{12} \sim b_9$=='0000'), the corresponding IQ data sample may be determined to be Type 3.

Then, based on the compression rule pertaining to the determined sample type, the target bits to be deleted are deleted from the IQ data sample, whereby data may be compressed.

For example, when the bits represented as being shaded in FIG. 7 are the target bits to be deleted, it may be determined that the compression rule shown in Table 2 is applied.

That is, according to Table 2, when the IQ data sample corresponds to Type 1, a single bit $b_{16}$, which is a sign bit or a sign extension bit, is deleted from the upper bits, and seven bits from $b_1$ to $b_7$ are deleted from the lower bits, whereby a compressed bit string may be generated. Also, when the IQ data sample corresponds to Type 2, four bits from $b_{16}$ to $b_{13}$ are deleted from the upper bits, and six bits from $b_1$ to $b_6$ are deleted from the lower bits, whereby a compressed bit string may be generated. Also, when the IQ data sample corresponds to Type 3, eight bits from $b_{16}$ to $b_9$ are deleted from the upper bits, and five bits from $b_1$ to $b_5$ are deleted from the lower bits, whereby a compressed bit string may be generated.

Here, the bits that are represented as not being shaded in FIG. 7 may be a compressed bit string, and the compressed bit string may be the data that is actually transmitted in the entire bit string of the IQ data sample.

Also, the processor 1120 generates compressed data, including at least one of a reference bit (or reference bits) corresponding to a sample type, the sign bit of the IQ data sample, and the compressed bit string, for each IQ data sample and transmits the compressed data to the reception apparatus. That is, in the present invention, compressed data may be generated and transmitted in units of IQ data samples without forming a block, whereby transmission delay may be prevented.

For example, referring to FIG. 8, in compressed data, the leftmost one bit or the leftmost two bits may be a reference bit or reference bits, the next one bit may be the sign bit of the original value of the corresponding IQ data sample, and the next N bits may be the compressed bit string to be transmitted for each sample type.

Here, the reference bit(s) may represent the sample type of the IQ data sample. However, because the reference bit(s) transmitted along with the compressed data may decrease a compression ratio, it is desirable to use as few bits as possible.

Accordingly, one reference bit may be allocated in order to indicate any one sample type that accounts for the greatest proportion, among two or more sample types, and at least two reference bits may be allocated in order to indicate each of the remaining sample types. Accordingly, the effect of the reference bit(s) on the compression ratio may be minimized. For example, when the signals in FIG. 7 are analyzed, the proportions of the IQ data samples classified as the respective sample types may be represented as 'Type 2>Type 1>Type 3'. Accordingly, one reference bit 710 may be allocated in order to indicate Type 2, and two reference bits 710 may be allocated in order to indicate Type 1 and Type 3.

Here, referring to FIG. 7, because $b_{16}$ is deleted from the IQ data sample corresponding to Type 1, one more dummy bit may be deleted when a compressed bit string is generated. According to the conventional block-scaling method, because all of the samples must retain their sign bits, $b_{16}$ cannot be deleted. That is, even in the case of IQ data samples of which the number of valid bits (Sn) is 15 or 14, the meaningless bit $b_{16}$ must be transmitted.

As shown in FIG. 8, the present invention separately transmits the sign bit 820, whereby additional data transmission load may not be imposed. Furthermore, in the case of other types of IQ data samples, sign bits are further deleted, whereby a higher compression ratio may be achieved than when another compression algorithm is used.

The memory 1130 stores at least one of the sample type determination rule, the compression rule, and the preset type.

Also, the memory 1130 may store various kinds of information that is generated in the above-described process of transmitting compressed data.

The use of the above-described transmission apparatus may improve compression efficiency and reduce signal transmission delay that may be caused due to IQ data compression.

According to the present invention, there may be provided a method for transmitting and receiving compressed data, which may improve compression efficiency and reduce signal transmission delay that may be caused due to I/O data compression.

Also, the present invention may reduce transmission delay that may be caused due to compression by applying different compression rules to IQ data samples depending on the types thereof.

Also, the present invention may improve compression efficiency by including even the sign bit of each IQ data sample in a target to be compressed by making IQ data samples have the same sign when data is compressed.

As described above, the method for transmitting and receiving compressed data and the apparatus therefor according to the present invention are not limitedly applied to the configurations and operations of the above-described embodiments, but all or some of the embodiments may be selectively combined and configured, and thus the embodiments may be modified in various ways.

What is claimed is:

1. A method for transmitting compressed data, comprising:
   standardizing, by a transmission apparatus for transmitting compressed data, a value of an In-phase/Quadrature-phase (IQ) data sample to a preset type that is selected from among a positive number and a negative number;
   determining, by the transmission apparatus, a sample type of the IQ data sample, the value of which is standardized to the preset type, based on a sample type determination rule and generating, by the transmission apparatus, a compressed bit string based on a compression rule pertaining to the sample type; and
   generating, by the transmission apparatus, compressed data, including at least one of a reference bit corresponding to the sample type, a sign bit of the IQ data sample, and the compressed bit string, for each IQ data sample and transmitting, by the transmission apparatus, the compressed data to a reception apparatus.

2. The method of claim 1, further comprising:
   setting, by the transmission apparatus, two or more sample types corresponding to the sample type determination rule in consideration of distribution of valid bits of multiple IQ data samples input to the transmission apparatus.

3. The method of claim 2, wherein the reference bit is allocated in an amount of one bit in order to indicate any one sample type that accounts for a greatest proportion, among the two or more samples, and the reference bit is allocated in an amount of at least two bits in order to indicate remaining sample types, excluding the sample type that accounts for the greatest proportion.

4. The method of claim 1, wherein standardizing the value of the IQ data sample is configured to convert bits of the IQ data sample according to a two's complement operation when the value of the IQ data sample does not correspond to the preset type.

5. The method of claim 4, wherein standardizing the value of the IQ data sample is configured to determine whether the value of the IQ data sample is a positive number or a negative number based on the sign bit.

6. The method of claim 1, wherein generating the compressed bit string comprises:
   dividing the IQ data sample into multiple groups of preset N bits based on the sample type determination rule; and
   determining the sample type depending on a value of at least one of leftmost N bits and N bits following the leftmost N bits.

7. The method of claim 1, wherein the compression rule includes parameter information corresponding to target bits to be deleted from each sample type.

8. The method of claim 1, wherein generating the compressed bit string is configured to delete a leftmost bit of the IQ data sample regardless of the sample type.

9. The method of claim 1, further comprising:
   sharing, by the transmission apparatus, at least one of the sample type determination rule and the compression rule with the reception apparatus.

10. A method for receiving compressed data, comprising:
determining, by a reception apparatus for receiving compressed data, a sample type of compressed data received from a transmission apparatus;
reconstructing, by the reception apparatus, an In-phase/Quadrature-phase (IQ) data sample corresponding to the compressed data using a compression rule pertaining to the sample type; and
correcting, by the reception apparatus, the IQ data sample by performing a two's complement operation on the IQ data sample based on a sign bit included in the compressed data.

11. The method of claim 10, further comprising:
receiving, by the reception apparatus, at least one of the compression rule and a sample type determination rule for determining the sample type from the transmission apparatus.

12. The method of claim 11, wherein determining the sample type is configured to determine the sample type by comparing a reference bit included in the compressed data with a reference bit for each sample type included in the sample type determination rule.

13. The method of claim 10, wherein reconstructing the IQ data sample comprises:
detecting a number of deleted upper bits and a number of deleted lower bits based on the compression rule;
reconstructing as many bits as the number of deleted upper bits before the compressed bit string included in the compressed data in consideration of a preset type, which is either a positive number or a negative number; and
generating a random value corresponding to the number of deleted lower bits and reconstructing bits after the compressed bit string using the random value.

14. The method of claim 13, wherein correcting the IQ data sample is configured to convert bits of the reconstructed IQ data sample according to a two's complement operation when the sign bit corresponds to the preset type.

15. The method of claim 10, wherein the compressed data sequentially includes a reference bit, the sign bit, and the compressed bit string corresponding to the IQ data sample.

16. An apparatus for transmitting compressed data, comprising:
a processor for standardizing a value of an In-phase/Quadrature-phase (IQ) data sample to a preset type that is selected from among a positive number and a negative number, determining a sample type of the IQ data sample, the value of which is standardized to the preset type, based on a sample type determination rule, generating a compressed bit string based on a compression rule pertaining to the sample type, generating compressed data, including at least one of a reference bit corresponding to the sample type, a sign bit of the IQ data sample, and the compressed bit string, for each IQ data sample, and transmitting the compressed data to a reception apparatus; and
memory for storing at least one of the sample type determination rule, the compression rule, and the preset type.

17. The apparatus of claim 16, wherein the processor sets two or more sample types corresponding to the sample type determination rule in consideration of distribution of valid bits of multiple IQ data samples input to the apparatus.

18. The apparatus of claim 17, wherein the reference bit is allocated in an amount of one bit in order to indicate any one sample type that accounts for a greatest proportion, among the two or more samples, and the reference bit is allocated in an amount of at least two bits in order to indicate remaining sample types, excluding the sample type that accounts for the greatest proportion.

19. The apparatus of claim 16, wherein the processor converts bits of the IQ data sample according to a two's complement operation when the value of the IQ data sample does not correspond to the preset type.

20. The apparatus of claim 16, wherein the processor divides the IQ data sample into multiple groups of N bits based on the sample type determination rule and determines the sample type depending on a value of at least one of leftmost N bits and N bits following the leftmost N bits.

* * * * *